United States Patent

Grant et al.

[15] 3,697,815

[45] Oct. 10, 1972

[54] COOLING HOOD FOR SUPPORTING PRINTED CIRCUIT BOARDS DURING BURN-IN

[72] Inventors: John Grant, Contoocook; Miner R. Longley, Pembroke, both of N.H.

[73] Assignee: Aerotronic Associates, Inc., Contoocook, N.H.

[22] Filed: Aug. 23, 1971

[21] Appl. No.: 173,891

[52] U.S. Cl. ..........317/100, 174/16 R, 317/101 DH, 211/128

[51] Int. Cl. ..........H05k 7/20

[58] Field of Search ..........174/15 R, 16 R; 108/92; 211/55, 128, 134; 312/236, 278; 317/99, 100, 101 DH

[56] References Cited

UNITED STATES PATENTS 3,602,774 8/1971 Grant ..........317/100

3,055,507 9/1962 Kobs ..........211/128 X 2,769,551 11/1956 Just ..........211/134 X 2,852,143 9/1958 Taber ..........211/134 X

*Primary Examiner*—Lewis H. Myers

*Assistant Examiner*—Gerald P. Tolin

*Attorney*—David H. Semmes

[57] ABSTRACT

Apparatus for burn-in of printed circuit boards, particularly a hood with electrical connections, supporting the printed circuit boards or trays in superposed, staggered relationship, and angularly disposed from the horizontal, so that the semi-conductors under test are exposed outwardly in ambient air and the power-dissipating load resistors are exposed inwardly. Heat shields below the individual boards reduces thermal interaction between trays. The heat from the load resistors rises vertically with entrained air through the top of the hood. Since the boards are staggered, and angularly disposed, fresh ambient air is enhancingly entrained at each level with the result that each board is thermally isolated from the other.

5 Claims, 3 Drawing Figures

INVENTORS
JOHN GRANT
MINER R. LONGLEY

David H. Semmes
ATTORNEY

INVENTORS
JOHN GRANT
MINER R. LONGLEY

David H. Semmes
ATTORNEY

COOLING HOOD FOR SUPPORTING PRINTED CIRCUIT BOARDS DURING BURN-IN

BACKGROUND OF THE INVENTION

In some types of military life test and burn-in systems, elevated temperatures are employed with the requirements that ambient air, rather than heated air, is required to be exposed to the semi-conductor device under test. In conventional life test and burn-in ovens, the heat generated by the semi-conductors under test and their load resistors is contained within the oven during the entire life test and burn-in. As a consequence, the semi-conductors are exposed to heat dissipated not only by the load on their own boards but the combined total of the heat dissipated by resistors on other boards. The inverse effects of radiation and convection combine to subject the boards to a heat factor considerably in excess of designed load.

According to the present invention, natural air convection is employed to carry the heat dissipated by each test board away from the board vertically and without exposure to other boards with the result that each board is isolated thermally from adjacent boards. As a result, each board is cooled by natural air convection.

DESCRIPTION OF THE PREFERRED EMBODIMENTS

Figure 1:
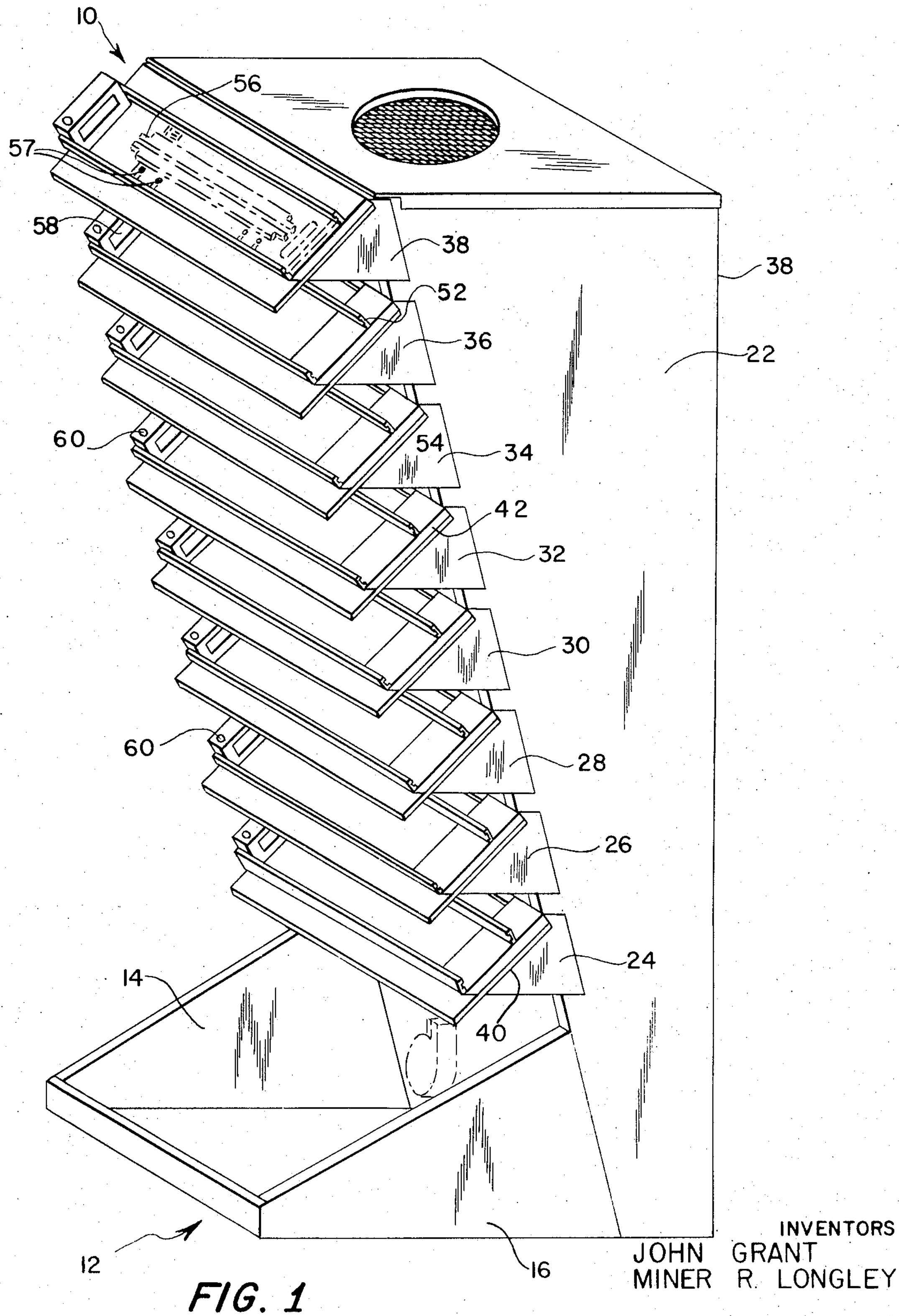
FIG. 1, is a perspective view of the invention showing a plurality of printed circuit boards positioned in superposed, staggered relationship on one side.
Figure 3:
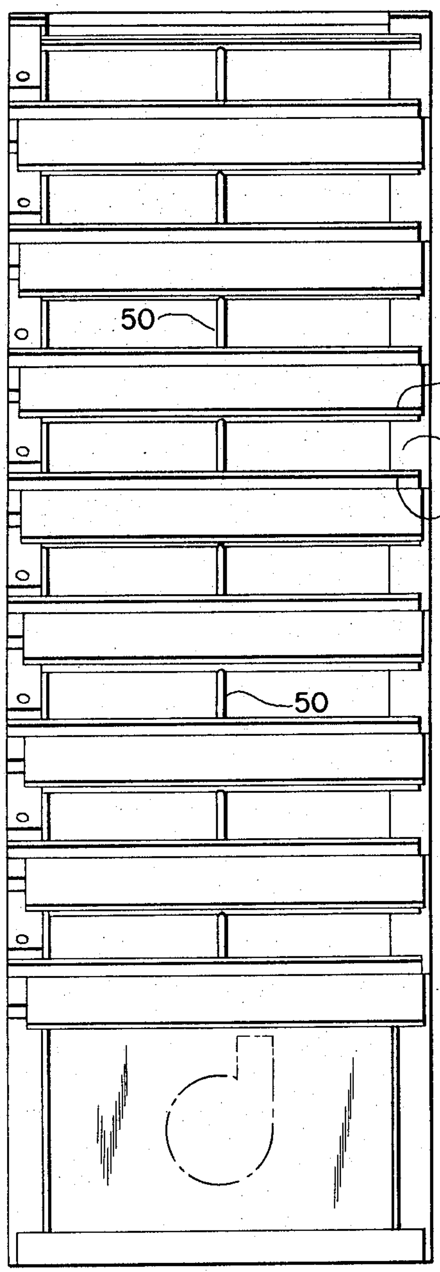
FIG. 3, is a side view of the system of the invention.
Figure 2:
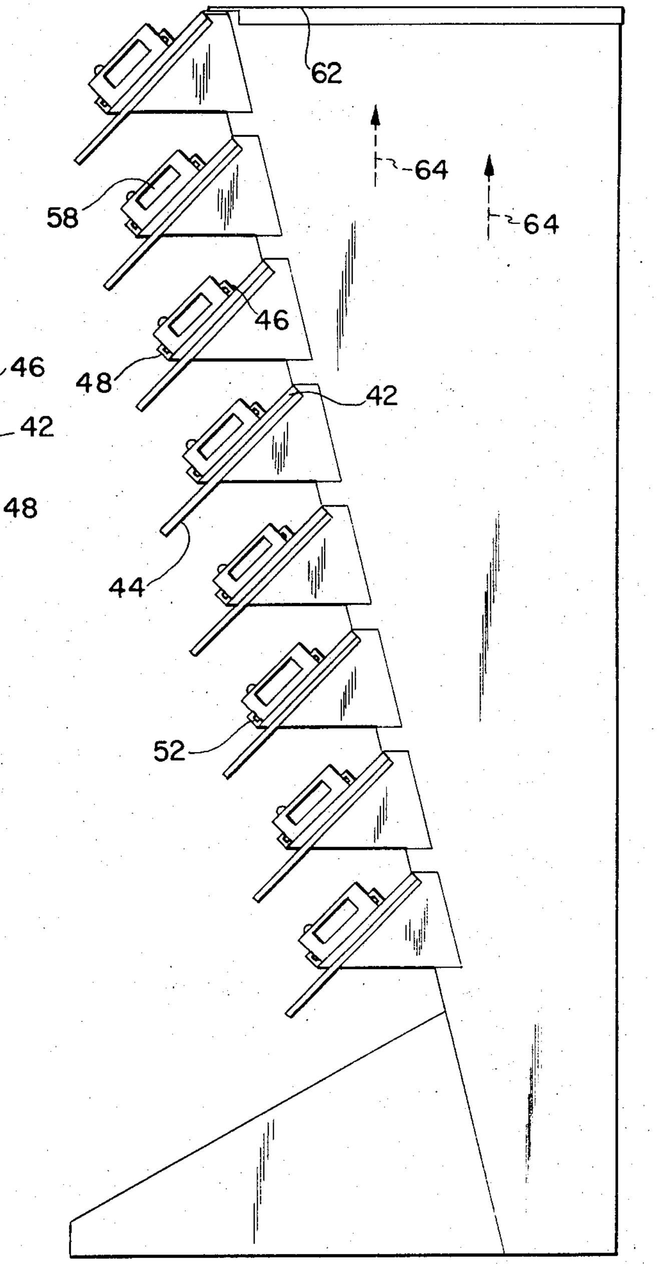
FIG. 2, is a front view, showing the staggered and angular positioning of the individual circuit boards in the channels formed by pairs of brackets.

In FIG. 1, a life test and burn-in system 10, is illustrated as comprised of base 12, truncated side supports 14 and 16, vertically rising back 38, and a pair of end panels of increasing width 22. The end panels support a plurality of pairs of mounting brackets 24, 26, 28, 30, 32, 34, 36, 38 having front edges 40 angularly disposed from the horizontal. Base panels 42 are mounted on the front edges 40, and interposed therebetween or otherwise attached, are extended heat shields 44 of appropriate material which serve in the test installation to reduce thermal interaction between trays under test. Superposed on each pair of base panels, and extending therebetween, are upper and lower guide rails 46, 48 respectively, with interposed spacers 50. The rails are preferably provided with guide channels 52 for insertion of trays generally indicated at 54.

The individual test trays 54 support a pin connector, not shown in detail, and wired to an electrical connector 56. Semi-conductor components 57 to be tested are positioned upon tray 54 by fitting board edges into the pin connectors, details of which are shown in greater detail in the aforesaid pending application. The pin connectors are secured to the tray 54 along their bottom surface and at the other end may be mounted in socket 58 by means of blue ribbon connector or similar connector device 56. A fuse 60 may be supported adjacent connector 56.

As will be apparent, the individual test trays are supported such that the components being tested are exposed outwardly of the hood, in a staggered array, and power-dissipating devices are supported inwardly, so that radiated heat may be carried away through the top of the hood 62 by means of convection currents indicated by arrows 64. Also, an optional blower 64, shown in phantom, may be mounted in the bottom.

The number of tray supports can be varied as desired, and the angle can vary from 0° to 90°.

Manifestly, the hood may be variously configured and the tray supporting brackets altered, without departing from the spirit of invention, as defined in the claims.

We claim:

1. A hood for supporting a plurality of printed circuit board trays in superposed relationship, comprising:

A. a base;

B. a pair of end panels of increasing width mounted upon said base;

C. a plurality of horizontally staggered circuit board supporting brackets on the front of said end panels;

D. a substantially flat back interconnecting said end panels;

E. slotted guide rails extending between pairs of supporting brackets at the front of said hood and defining support means for engaging side edges of trays for said circuit boards; and F. outwardly extended heat shields mounted on said brackets below said support means for reducing thermal interaction between trays.

2. A hood as claimed in claim 1, wherein the supporting brackets have front edges angularly disposed from the horizontal.

3. A hood as claimed in claim 2, including:

G. a blower mounted beneath said circuit board supporting brackets, so as to create a negative pressure within said hood and inwardly of said circuit boards.

4. A hood as claimed in claim 3, including:

H. an electrical connecting bracket at one end of each pair of brackets engageable with a complementary electrical connector within said tray mounted in said channels.

5. The combination of:

A a printed circuit board tray of the type including a rectangular frame defining an electrical connector support at one end;

B a printed circuit board mounted upon said frame so that its sides extend in parallel thereof; and C a hood as in claim 5, said tray being inserted in said channel so that its electrical connector mates with said electrical connecting bracket in said pair of end brackets.

* * * * *